(12) United States Patent
Zhu et al.

(10) Patent No.: US 7,027,268 B1
(45) Date of Patent: Apr. 11, 2006

(54) METHOD AND SYSTEM FOR PROVIDING A DUAL SPIN FILTER

(75) Inventors: Ningjia Zhu, Cupertino; Yiming Huai, Pleasanton, both of CA (US)

(73) Assignee: Western Digital (Fremont), Inc., Fremont, CA (US)

( * ) Notice: Subject to any disclaimer, the term of this patent is extended or adjusted under 35 U.S.C. 154(b) by 0 days.

(21) Appl. No.: 09/351,743

(22) Filed: Jul. 8, 1999

(51) Int. Cl.
*G11B 5/39* (2006.01)

(52) U.S. Cl. .................................. 360/314; 324/207.21

(58) Field of Classification Search ................. 360/314, 360/315, 316; 324/207.21, 252; 338/32 R See application file for complete search history.

(56) References Cited

U.S. PATENT DOCUMENTS 6,252,750 B1 * 6/2001 Gill ...................... 360/324.11

\* cited by examiner

*Primary Examiner*—George J. Letscher
(74) *Attorney, Agent, or Firm*—Sawyer Law Group LLP

(57) ABSTRACT

A method and system for providing a magnetoresistive sensor is disclosed. The method and system include providing a first pinned layer, providing a free layer having a length, and providing a first spacer layer disposed between the first pinned layer and the free layer. The first spacer layer has a first interface with the first pinned layer. The method and system also include providing a second pinned layer and providing a second spacer layer disposed between the free layer and the second pinned layer. The second spacer layer has a second interface with the second pinned layer. A direction of a current passed through the magnetoresistive sensor is through the first interface, through the second interface, and along at least a portion of the length of the free layer.

19 Claims, 6 Drawing Sheets

METHOD AND SYSTEM FOR PROVIDING A DUAL SPIN FILTER

FIELD OF THE INVENTION

The present invention relates to magnetic recording technology and more particularly to a method and system for providing a dual spin filter which can be used in magnetoresistive read heads.

BACKGROUND OF THE INVENTION

Currently, magnetoresistance (MR) heads are currently used in read heads or for reading in a composite head. MR heads use a MR sensor in order to read data that has been stored in magnetic recording media. Giant magnetoresistance ("GMR") has been found to provide a higher signal for a given magnetic field. GMR is based on spin dependent scattering at magnetic interfaces. Spin dependent scattering at interfaces is described in an article by S. Parkin in 71 Phys. Rev. Let. P. 1641 (1993).

Conventional MR sensors which utilizes GMR to sense the magnetization stored in recording media typically include at least two magnetic layers separated by nonmagnetic layer. The magnetization of one of the magnetic layers is free to rotate in response to an external magnetic field. This magnetic layer is known as the free layer. The magnetization of the other magnetic layer is fixed in place, typically using an antiferromagnetic ("AFM") layer. This magnetic layer is known as the pinned layer. For the purposes of this disclosure, this physical structure will be termed a conventional spin valve. However, as discussed below, current can be driven through the conventional spin valve in different directions. The conventional spin valve may also include a capping layer. The spacer layer separates the free layer from the pinned layer. The magnetization of the pinned layer is typically fixed by exchange coupling to the conventional AFM layer. More recently, another MR sensor has been developed. For the purposes of this disclosure, the physical structure of this recently developed MR sensor will be called a conventional dual spin valve. The conventional dual spin valve includes a first AFM layer, a pinned layer on the first AFM layer, a first spacer on the first AFM layer, a free layer on the first spacer layer, a second spacer layer on the free layer, a second pinned layer on the second spacer layer, and a second AFM layer on the second pinned layer. The pinned layers and the free layer are still magnetic layers. The magnetization of the first and second pinned layers is fixed by an exchange coupling with the first and second AFM layers, respectively. Because there are more interfaces between the spacer layers and the magnetic (pinned and free) layers, the conventional dual spin valve has more scattering surfaces. As a result, the conventional dual spin valve has a higher MR.

In order to use the conventional spin valve or the conventional dual spin valve as a conventional MR sensor, current is passed through the conventional MR sensor as the MR head is brought in proximity to a recording media. Based on the information stored in the recording media, the magnetization of the free layer can change direction, altering the resistance of the conventional MR sensor. The resistance is low when the magnetizations of the free layer and pinned layers are approximately parallel. The resistance is high when the magnetization of the free layer is approximately antiparallel to the magnetizations of the pinned layers. Thus, the conventional MR sensor can be used to read the data stored by the recording media.

Conventional spin valves and dual spin valves can be used in two configurations. These configurations are based on the direction in which current is driven through the magnetoresistive sensor. Current can be passed through the conventional spin valve or the conventional dual spin valve within the plane of the layers, otherwise known as a current in plane ("CIP") configuration. Current can also be driven perpendicular to the layers of the conventional spin valve or the conventional dual spin valve. This is known as a current perpendicular to the plane ("CPP") configuration. For both the CIP and CPP configurations, the resistance is low when the magnetizations of the free layer and pinned layers are approximately parallel and high when the magnetization of the free layer is approximately antiparallel to the magnetizations of the pinned layers.

Although both configurations provide a signal based on the MR of the conventional spin valve or the conventional dual spin valve, each configuration has its drawbacks. The signal provided by a conventional MR sensor is proportional to the sheet resistance of the sensor, proportional to the MR of the sensor, and proportional to the read track width of the sensor. The MR of the sensor is defined as the change in resistance due to the change in magnetization divided by the resistance ($\Delta R/R$). The read track width of the sensor is typically the length of the sensor. The CIP configuration has a higher overall sheet resistance than the CPP configuration. However, the CPP configuration has a higher MR than the CIP configuration. Furthermore, as magnetic recording technology progresses to higher densities, the read track width may decrease, further reducing the signal from the conventional sensor used in the CIP configuration.

Accordingly, what is needed is a system and method for providing a MR sensor having a higher signal. It would also be desirable for the MR sensor to provide a signal which is less dependent upon the read track width of the sensor. The present invention addresses such a need.

SUMMARY OF THE INVENTION

The present invention provides method and system for providing a magnetoresistive sensor. The method and system comprise providing a first pinned layer, providing a free layer having a length, and providing a first spacer layer disposed between the first pinned layer and the free layer. The first spacer layer has a first interface with the first pinned layer. The method and system also comprise providing a second pinned layer and providing a second spacer layer disposed between the free layer and the second pinned layer. The second spacer layer has a second interface with the second pinned layer. A direction of a current passed through the magnetoresistive sensor is through the first interface, through the second interface, and along at least a portion of the length of the free layer.

According to the system and method disclosed herein, the present invention provides a magnetoresistive sensor that can be used to read higher recording densities.

DETAILED DESCRIPTION OF THE INVENTION

The present invention relates to an improvement in magnetoresistive sensors. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

Figure 1:
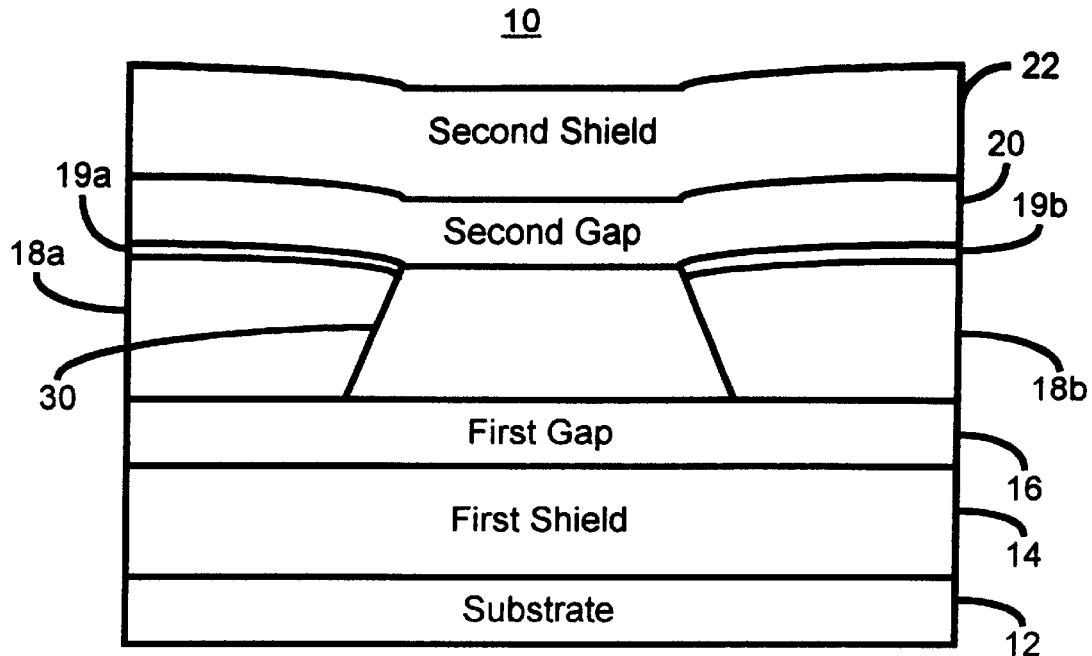
FIG. 1 is a diagram of a magnetoresistive head.

FIG. 1 is a block diagram of a magnetoresistance ("MR") head 10. The MR head 10 includes a first shield 14 formed on a substrate 12. The MR head 10 also includes a first gap 16 separating a MR sensor 30 from the first shield 14. The MR head 10 also includes a pair of hard bias layers 18a and 18b. The hard bias layers 18a and 18b magnetically bias layers in the MR element 30. The MR head 10 also includes lead layers 19a and 19b, which conduct current to and from the MR element 30. A second gap 20 separates the MR sensor 30 from a second shield 22. When brought in proximity to a recording media (not shown), the MR head 10 reads data based on a change in the resistance of the MR sensor 30 due to the field of the recording media.

Figure 2A:
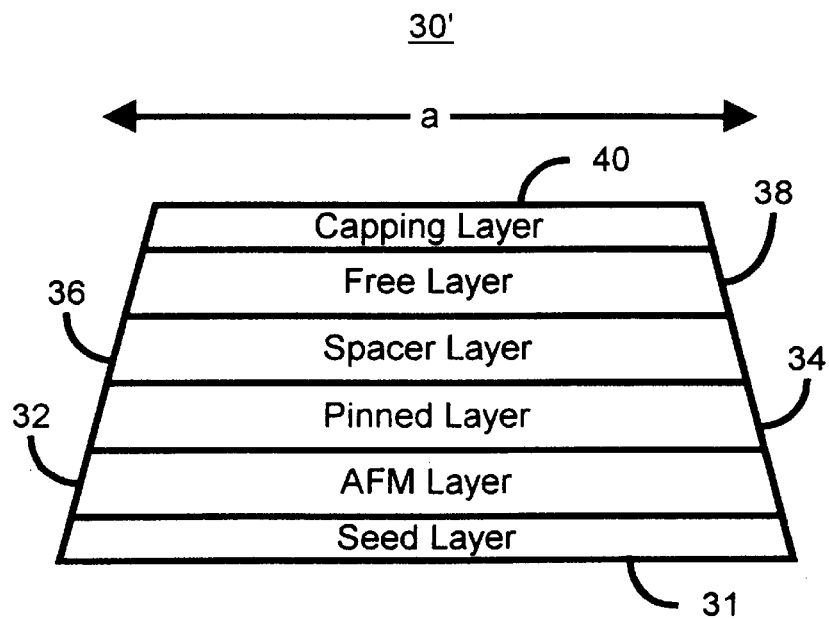
FIG. 2A is a diagram of a conventional spin valve.
Figure 2B:
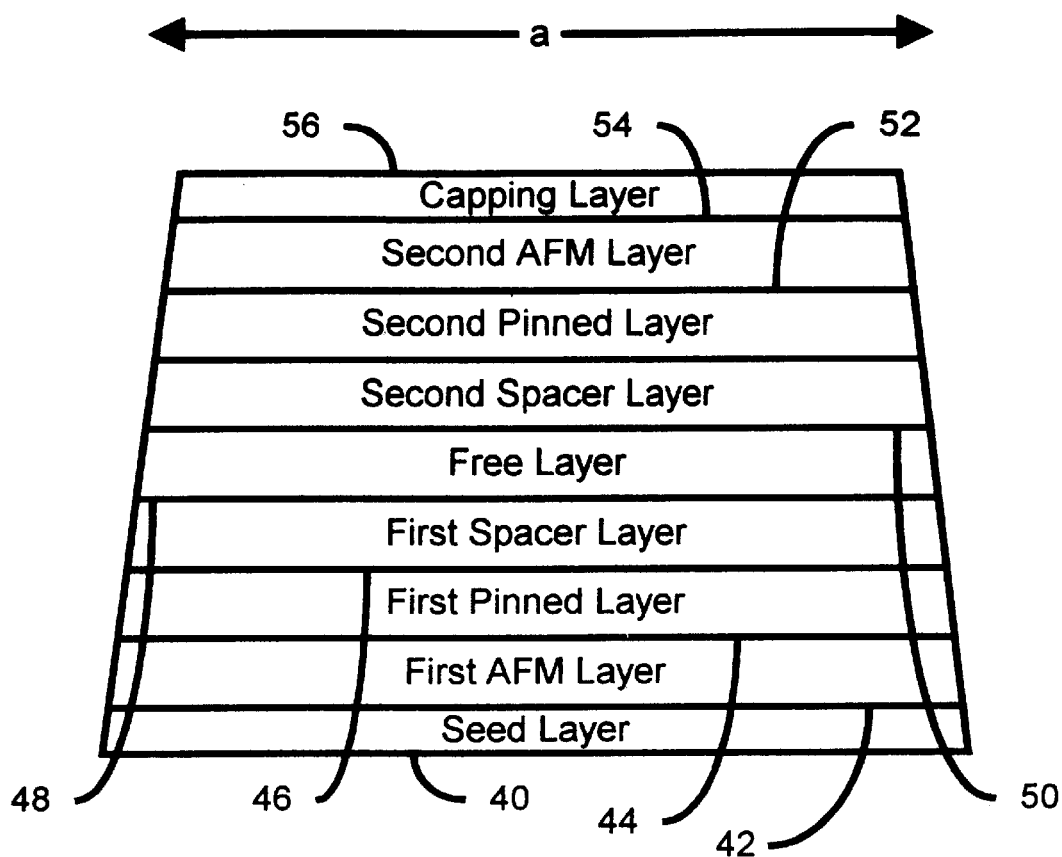
FIG. 2B is a diagram of a conventional dual spin valve.

In conventional systems, the MR sensor 30 is a spin valve or a dual spin valve, which sense magnetically stored data using giant magnetoresistance ("GMR"). FIGS. 2A and 2B depict a conventional spin valve 30' and a conventional dual spin valve 30". Referring to FIG. 2A, the conventional spin valve 30' typically includes a seed layer 31, an antiferromagnetic ("AFM") layer 32, a pinned layer 34, a spacer layer 36, a free layer 38, and a capping layer 40. The seed layer is used to ensure that the material used for the AFM layer 32 has the appropriate crystal structure and is antiferromagnetic in nature. The spacer layer 36 is a nonmagnetic metal, such as copper. The pinned layer 34 and the free layer 38 are magnetic layers, such as CoFe. The magnetization of the pinned layer 34 is pinned in place due to an exchange coupling between the AFM layer 32 and the pinned layer 34. The magnetization of the free layer 38 is free to rotate. The read track width for the conventional spin valve 30' is given by the distance a.

Referring now to FIG. 2B, the conventional dual spin valve 30" typically includes a seed layer 40, a first AFM layer 42, a first pinned layer 44, a first spacer layer 46, a free layer 48, a second spacer layer 50, a second pinned layer 52, a second AFM layer 54, and a capping layer 56. The seed layer is used to ensure that the material used for the AFM layer 42 has the appropriate crystal structure and is antiferromagnetic in nature. The first spacer layer 46 and the second spacer layer 50 are made from a nonmagnetic metal, such as copper. The first pinned layer 44, the second pinned layer 52, and the free layer 48 are magnetic layers, such as CoFe. The magnetization of the first pinned layer 44 is pinned in place due to an exchange coupling between the first AFM layer 42 and the first pinned layer 44. The magnetization of the second pinned layer 52 is pinned in place due to an exchange coupling between the second AFM layer 54 and the second pinned layer 52. The magnetization of the free layer 48 is free to rotate. The read track width for the conventional dual spin valve 30" is given by the distance a.

In order to use the conventional spin valve 30' or the conventional dual spin valve 30", current can be driven in a direction parallel to or perpendicular to the layers 32–38 or the layers 42–54. When current is driven parallel to the layers, the conventional spin valve 30' or the conventional dual spin valve 30" is in a current in plane ("CIP") configuration. The MR head 10 is shown in the CIP configuration. When current is driven perpendicular to the layers, the conventional spin valve 30' or the conventional dual spin valve 30" is in a current perpendicular to the plane ("CPP") configuration. In either configuration, the conventional spin valve 30' or the conventional dual spin valve 30" are capable of sensing data magnetically stored in a recording media. For CIP and CPP configurations, the magnetization of the recording media is sensed because the angle between the magnetization of the free layer and the magnetizations of the pinned layers affects the resistance of the conventional spin valve 30' or the conventional dual spin valve 30". The magnetization of the free layer 38 or 48 rotates in directions into or out of the plane of the page in response to an external field. Thus, the resistance is low when the magnetizations of the free layer 38 or 48 and pinned layers 34 or 44 and 52, respectively, are approximately parallel. The resistance is high when the magnetization of the free layer 38 or 48 is approximately antiparallel to the magnetizations of the pinned layers 34 or 44 and 52, respectively: Thus, rotation of the magnetization of the free layer 38 or 48 in response to the field from the recording media allows the conventional spin valve 30' or the conventional dual spin valve 30" to read the recording media.

Although the conventional spin valve 30' or the conventional dual spin valve 30" function, one of ordinary skill in the art will realize that the signal generated by either the CIP or the CPP configurations is lower than desired. The signal generated by either the conventional spin valve 30' or the conventional dual spin valve 30" is proportional to the sheet resistance of the sensor and proportional to the MR of the sensor. The MR of the MR sensor 30 is defined as the change in resistance due to the change in magnetization divided by the resistance ($\Delta R/R$). The MR of the conventional spin valve 30' or the conventional dual spin valve 30" is higher for the CPP configuration. However, the sheet resistance of the CPP configuration is relatively low. As a result, the signal generated by the conventional spin valve 30' or the conventional dual spin valve 30" in the CPP configuration is relatively low.

The sheet resistance of the conventional spin valve 30' or the conventional dual spin valve 30" when used in the CIP configuration is relatively high. However, charge carriers passing through the conventional spin valve 30' or the conventional dual spin valve 30" may undergo less spin dependent scattering. Therefore, the MR of the CIP configuration is smaller. As a result, the signal generated by the CIP configuration is also lower.

Furthermore, the signal generated by the CIP configuration is proportional to the read track width of the conventional spin valve 30' or the conventional dual spin valve 30". As magnetic recording technology moves to higher densities, the size of the stored bits decreases. Consequently, it is desirable to decrease the size of the read track width. However, a decrease in the read track width results in a lower signal for the CIP configuration of the conventional spin valve 30' or the conventional dual spin valve 30". Consequently, it may become increasingly difficult for the conventional spin valve 30' or the conventional dual spin valve 30" to read at higher densities.

The conventional spin valve 30' and the conventional dual spin valve 30" also have a relatively low operating temperature limit. The magnetizations of the pinned layers 34, 44, and 52 are pinned by an exchange coupling with the antiferromagnetic layers 32, 42, and 54, respectively. However, the exchange coupling drops to zero at the blocking temperature. The exchange coupling typically begins to fall off below the blocking temperature. When the magnetizations of the pinned layers 34, 44, and 52 are not pinned, the MR of the conventional spin valve 30' and the conventional dual spin valve 30" is greatly reduced, rendering the conventional spin valve 30' and the conventional dual spin valve 30" unusable. Thus, the blocking temperature limits the operating temperature range of the conventional spin valve 30' and the conventional dual spin valve 30".

The present invention provides method and system for providing a magnetoresistive sensor. The method and system comprise providing a first pinned layer, providing a free layer having a length, and providing a first spacer layer disposed between the first pinned layer and the free layer. The first spacer layer has a first interface with the first pinned layer. The method and system also comprise providing a second pinned layer and providing a second spacer layer disposed between the free layer and the second pinned layer. The second spacer layer has a second interface with the second pinned layer. A direction of a current passed through the magnetoresistive sensor is through the first interface, through the second interface, and along at least a portion of the length of the free layer.

The present invention will be described in terms of a particular magnetoresistive head and particular materials used in the magnetoresistive sensor. However, one of ordinary skill in the art will readily recognize that this method and system will operate effectively for other magnetoresistive head and other materials.

Figure 3A:
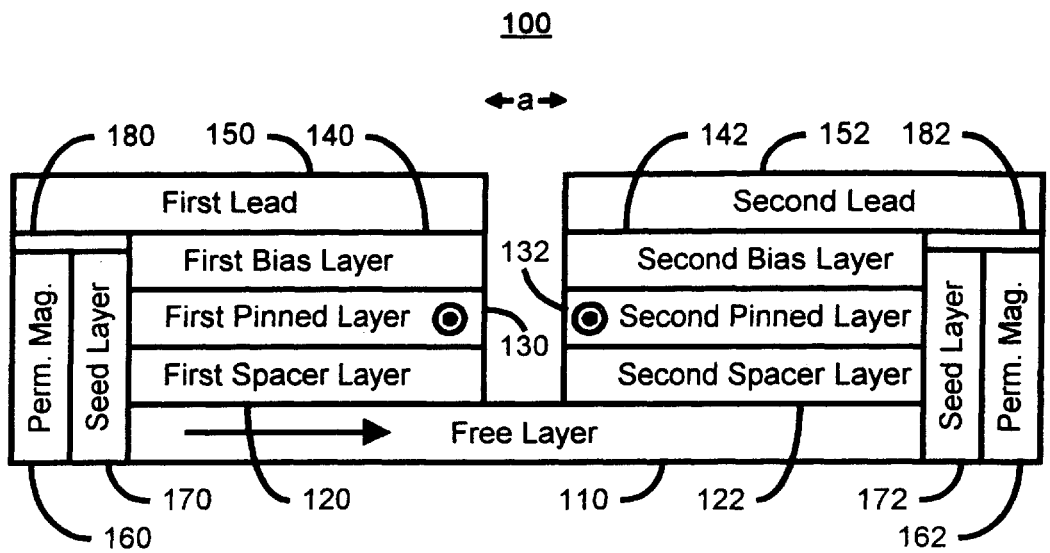
FIG. 3A is a simplified diagram of one embodiment of a dual spin filter in accordance with the present invention.

To more particularly illustrate the method and system in accordance with the present invention, refer now to FIG. 3A, depicting a simplified diagram of one embodiment of a dual spin filter 100 in accordance with the present invention. The dual spin filter 100 can be incorporated into an MR head, such as the MR head 10. The dual spin filter 100 includes a magnetic free layer 110, a first spacer layer 120 and a second spacer layer 122 above the free layer 110, a first pinned layer 130 and a second pinned layer 132. The magnetization of the free layer 110 is substantially longitudinal, in the plane of the page as depicted in FIG. 3A. The pinned layers 130 and 132 are magnetic. The first spacer layers 120 and 122 are preferably a nonmagnetic metal. The magnetizations of the pinned layers 130 and 132 are pinned by bias layers 140 and 142. In one embodiment, the bias layers 140 and 142 are antiferromagnetic ("AFM") layers that bias the pinned layers 130 and 132 through an exchange coupling. In another embodiment, the bias layers 140 and 142 are permanent magnets which bias the pinned layers 130 and 132 via magnetostatic coupling. Thus, the bias layers 140 and 142 may be either AFM layers or permanent magnets. Furthermore, in yet another embodiment, the pinned layers 130 and 132 may be permanent magnets. In such an embodiment, the bias layers 140 and 142 may be omitted. Such an embodiment is discussed below with respect to FIG. 4. The magnetizations of the pinned layers 130 and 132 are transverse. For example, in one embodiment, the magnetizations of the pinned layers 130 and 132 are approximately out of the plane of the page, as depicted in FIG. 3A. Also depicted are first and second leads 150 and 152, which may correspond to the leads 19a and 19b. Also depicted are hard bias layers 160 and 162, separated from the remainder of the dual spin filter 100 by seed layers 170 and 172, respectively. In a preferred embodiment, layers 170 and 172 are Cr layers. The hard bias layers 160 and 162 may be used to bias the magnetization of the free layer 100, thereby ensuring that the free layer 110 has substantially single domain structure. In one embodiment, the first lead 150, the first bias layer 140, the first pinned layer 130, and the first spacer layer 120 are separated from the second lead 152, the second bias layer 142, the second pinned layer 132, and the second spacer layer 122, respectively, by the read track width, a. Although the read track width, a, not be identical to the magnetic read track width of the dual spin filter 100, this read track width is analogous to the magnetic read track width. The dual spin filter 100 is also depicted with optional insulating layers 180 and 182. The optional insulating layer 180 electrically isolates the first lead 150 from the permanent magnet 160 and the seed layer 170. Similarly, the optional insulating layer 182 electrically isolates the second lead 152 from the permanent magnet 162 and the seed layer 172. Note that in an alternate embodiment, an additional magnetic compensation layer can be provided next to the free layer 110. However, some of the advantages of the dual spin filter 100' may be difficult to achieve in such an embodiment.

Figure 3B:
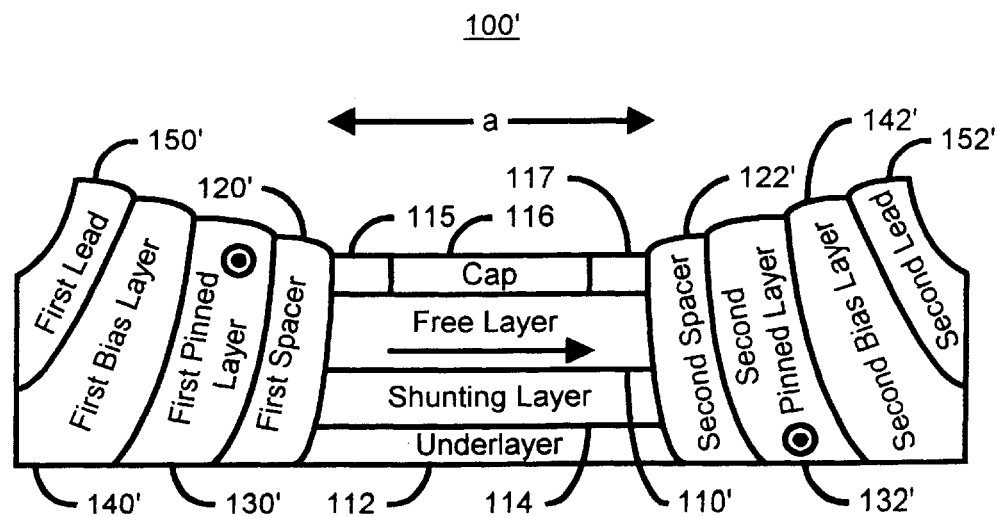
FIG. 3B is a diagram of another embodiment of a dual spin filter and magnetic biasing in accordance with the present invention.

FIG. 3B depicts another embodiment of the dual spin filter 100'. The dual spin filter 100' can be incorporated into an MR head, such as the MR head 10. The dual spin filter 100' includes a magnetic free layer 110', tantalum underlayer 112 and capping layer 116, and an optional copper shunting layer 114. The magnetization of the free layer 110 is substantially longitudinal, as depicted in FIG. 3B. In a preferred embodiment, the copper shunting layer 114 may be omitted. The dual spin filter 100' also includes a first spacer layer 120' and a second spacer layer 122' above the free layer 110', a first pinned layer 130' and a second pinned layer 132'. Also in a preferred embodiment, the dual spin filter 100' includes AFM layers 115 and 117, which may be used to magnetically bias the free layer 110'. The pinned layers 130' and 132' are magnetic. The first spacer layers 120' and 122' are preferably a nonmagnetic metal. The magnetizations of the pinned layers 130' and 132' are pinned by bias layers 140' and 142'. In one embodiment, the bias layers 140' and 142' are AFM layers that bias the pinned layers 130' and 132' through an exchange coupling. In another embodiment, the bias layers 140' and 142' are permanent magnets which bias the pinned layers 130' and 132' via magnetostatic coupling. Thus, the bias layers 140' and 142' may be either AFM layers or permanent magnets. Furthermore, in yet another embodiment, the pinned layers 130' and 132' may be permanent magnets. In such an embodiment, the bias layers 140' and 142' may be omitted. The magnetizations of the pinned layers 130' and 132' are preferably transverse. For example, in one embodiment, the magnetizations of the pinned layers 130' and 132' are substantially out of the plane of the page, as depicted in FIG. 3B. Also depicted are first and second leads 150' and 152', which may correspond to the leads 19a and 19b. In one embodiment, the first lead 150', the first bias layer 140, the first pinned layer 130', and the first spacer layer 120' are separated from the second lead 152', the second bias layer 142,' the second pinned layer 132', and the second spacer layer 122', respectively, by the read track width, a. Although the read track width, a, not be identical to the magnetic read track width of the dual spin filter 100', this read track width is analogous to the magnetic read track width. Note that in an alternate embodiment, an additional magnetic compensation layer could be provided next to the free layer 110'. However, some of the advantages of the dual spin filter 100' may be difficult to achieve in such an embodiment.

In addition, note that the dual spin filters 100 and 100' depicted in FIGS. 3A and 3B, respectively, represent two extreme cases. In the dual spin filter 100, the first and second bias layers 140 and 142, the first and second pinned layers 130 and 132, and the first and second spacer layers 120 and 122 are substantially parallel to the free layer 110. In contrast, in the dual spin filter 100', the first and second bias layers 140' and 142', the first and second pinned layers 130' and 132', and the first and second spacer layers 120' and 122' are substantially perpendicular to the free layer 110'. However, the present invention is not limited to dual spin filters having the first and second bias layers, the first and second pinned layers, and the first and second spacer layers either substantially parallel to or substantially perpendicular to the free layer. Alternate embodiments of the dual spin filter (not shown) could have the first and second bias layers, the first and second pinned layers, and the first and second spacer layers each at some angle with the free layer. In such embodiments, the first and second bias layers, the first and second pinned layers, and the first and second spacer layers could be somewhere between parallel to and perpendicular to the free layer. These embodiments operate similarly to and are consistent with the dual spin filters 100 and 100'.

As discussed above, the magnetizations for the free layers 110 and 110' of the dual spin filters 100 and 100' are also substantially longitudinal, or substantially in or opposite to the direction current travels through the free layers 110 and 110' during use. The first pinned layers 130 and 130' as well the second pinned layers 132 and 132' preferably have magnetizations which are transverse, approximately out of the plane of the page. The magnetization of a recording media is sensed because the angle between the magnetization of the free layer 110 or 110' and the magnetizations of the pinned layers 130 and 132 or 130' and 132', respectively, affects the resistance of the dual spin filters 100 and 100', respectively. The magnetization of the free layer 110 or 110' rotates in directions into or out of the plane of the page in response to an external field. As a result, the resistance is low when the magnetizations of the free layer 110 or 110' and pinned layers 130 and 132 or 130' and 132', respectively, are approximately parallel. The resistance is high when the magnetization of the free layer 110 or 110' is approximately antiparallel to the magnetizations of the pinned layers 130 and 132 or 130' and 132', respectively. Thus, rotation of the magnetization of the free layer 110 or 110' in response to the field from the recording media allows the dual spin filters 100 and 100' to read the recording media.

The dual spin filters 100 and 100' may also be operated similarly to conventional spin valves 30' and 30" when used in the CIP configuration. Thus, the geometry of the dual spin filters 100 and 100' are relatively similar to the CIP configuration. However, current travels between the leads 150 and 152 or 150' and 152' in the dual spin filters 100 and 100', respectively. Thus, charge carriers pass through the interfaces between the pinned layers 130 and 132 or 130' and 132' and the spacer layers 120 and 122 or 120' and 122', respectively. In addition, as described above, the maximum and minimum signals occur for similar orientations of the magnetizations of the free layer 110 or 110' and the pinned layers 130 and 132 or 130' and 132'. Consequently, certain aspects of the behavior of the dual spin filters 100 and 100' may be an intermediate, between the CIP and CPP configurations. Thus, the dual spin filters 100 and 100' may have advantages over both the CIP and CPP configurations.

For example, current travels through interfaces between the pinned layers 130 and 132 or 130' and 132' and the spacer layers 120 and 122 or 120' and 122', respectively. Current also travels longitudinally along the free layer 110 and 110'. This gives charge carriers a greater opportunity to undergo spin dependent scattering due to the pinned layers 130 and 132 or 130' and 132' as well as the free layer 110 or 110'. Thus, the MR of the dual spin filters 100 and 100' may be between the CPP and the CIP configurations. The signal from the dual spin filters 100 and 100' is thus higher than the CIP configuration. Furthermore, the dependence of the MR is proportional to the track width for the CIP configuration, but inversely proportional to the track width for the CPP configuration. Thus, the MR of the dual spin filters 100 and 100' may be less dependent on the track width than either the CPP or CIP configurations. In a preferred embodiment, the MR of the dual spin filters 100 and 100' is relatively independent of the track width, a. As track width shrinks, a smaller dependency on the track width is desirable over the CIP configuration. Furthermore, as discussed with respect to FIG. 5, below, the dual spin filters 100 and 100' may be relatively simple to process using current techniques. This is in contrast to the CPP configuration. Thus, the dual spin filters 100 and 100' are relatively simple to process, may have higher MR, and be less dependent on the track width.

Figure 4:
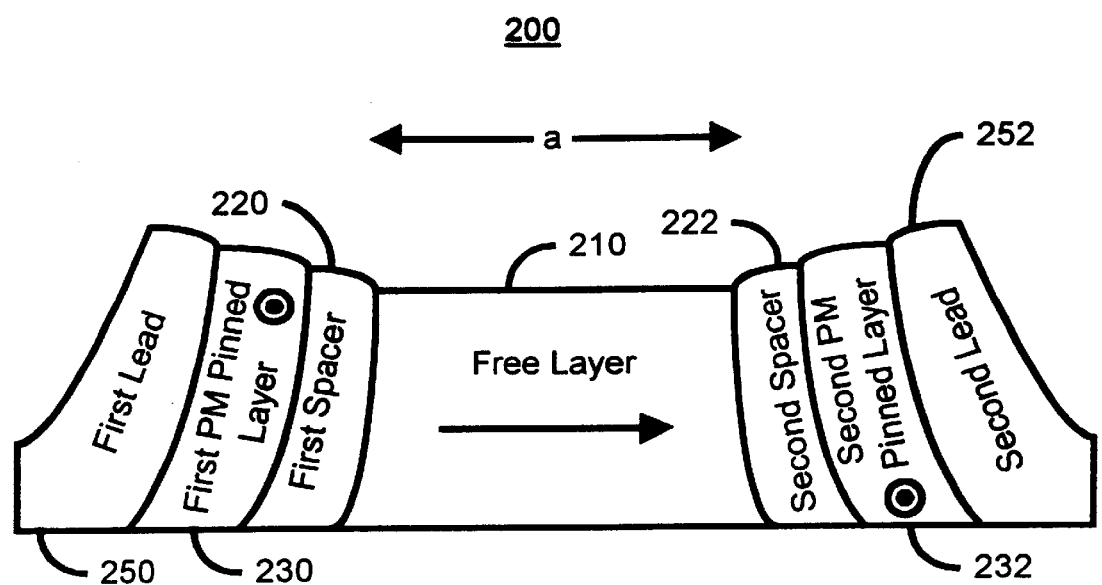
FIG. 4 is a diagram of another embodiment of a dual spin filter in accordance with the present invention.

FIG. 4 depicts another embodiment of the dual spin filter 200. The dual spin filter 200 can be incorporated into an MR head, such as the MR head 10, in place of the sensor 30, leads 19a and 19b, and bias layers 18a and 18b. The dual spin filter 200 includes a magnetic free layer 210, a first spacer layer 220 and a second spacer layer 222 above the free layer 210, a first pinned layer 230 and a second pinned layer 232. The first spacer layers 220 and 222 are preferably a nonmagnetic metal. The pinned layers 230 and 232 are permanent magnetic. Thus, the magnetizations of the pinned layers 230 and 232 are pinned by the coercivity of the permanent magnets used to form the pinned layers 230 and 232. Also depicted are first and second leads 250 and 252, which may correspond to the leads 19a and 19b. Because permanent magnets are used for the pinned layers 230 and 232, no hard bias layers are necessary for pinning the magnetizations of the pinned layers 230 and 232. Moreover, the pinned layers 250 and 252 can bias the magnetization of the free layer 210, to try to ensure that the free layer 210 has a single domain structure.

The first lead 250, the first pinned layer 230, and the first spacer layer 220 are separated from the second lead 252, the second pinned layer 232, and the second spacer layer 222, respectively, by the read track width, a. Although the read track width, a, not be identical to the magnetic read track width of the dual spin filter 200, this read track width is analogous to the magnetic read track width. Note that in an alternate embodiment, an additional magnetic compensation layer could be provided next to the free layer 210. However, some of the advantages of the dual spin filter 200 may be difficult to achieve in such an embodiment.

Also depicted in FIG. 4 are the magnetizations of the free layer 210, the first pinned layer 230, and the second pinned layer 232. The magnetization of the free layer 210 is substantially longitudinal. Thus, the magnetization of the free layer is preferably substantially along or opposite to the direction which current is driven through the dual spin filter 200. The magnetizations of the pinned layers 230 and 232 are substantially transverse. For example, the magnetizations of the pinned layers 230 and 232 are depicted as being out of the plane of the page in FIG. 4. Furthermore, the MR or the dual spin filter 200 is similar to that of the dual spin filters 100 and 100'. The magnetization of the free layer 210 rotates in directions into or out of the plane of the page in response to an external field. The resistance of the dual spin filter 200 depends upon the angle between the magnetization of the pinned layers 230 and 232 and the magnetization of the free layer 210. The dual spin filter 200 has a higher resistance when the magnetizations of the pinned layers 230 and 232 are substantially antiparallel to the magnetization of the free layer 210. The dual spin filter has a lower resistance when the magnetizations of the pinned layers 230 and 232 are substantially parallel to that of the free layer 210. Because of the configuration of the dual spin filter 200, substantially the same advantages may be achieved as for the dual spin filters 100 and 100'. Thus, the dual spin filter 200 preferably has a higher MR and lower dependence on track width than the CIP configuration. Furthermore, the dual spin filter 200 is simpler to process using current techniques than the CPP configuration.

As discussed above, current is carried to and from the dual spin filter 100, 100', or 200 by the leads 150 and 152, 150' and 152', or 250 and 252, respectively. Thus, current passes through the interface between the first pinned layer 130, 130', or 230 and the first spacer layer 120, 120', or 220. Current also passes through the interface between the first spacer layer 120, 120', or 220 and the free layer 110, 110', or 210. Current also travels along the free layer 110, 110', or 210. Current also passes through the interface between the free layer 110, 110', or 210 and the second spacer 122, 122', or 222. Current also travels through the interface between the second spacer 122, 122', or 222 and the second pinned layer 132, 132', or 232. For example, current may be driven from the first lead 150, 150', or 250 through the first pinned layer 130, 130', or 230 and along the free layer 110, 110', 210. Current also travels through the second pinned layer 132, 132', or 232 to the second lead 152, 152', or 252.

Currently, there is some disagreement among theorists as to whether GMR is due to spin dependent scattering at magnetic interfaces or spin dependent scattering in the bulk. Under either theory, the dual spin filters 100, 100', and 200 should have greater MR than the CIP configuration. Because current is driven through the magnetic interfaces of the dual spin filters 100, 100', and 200 there is a greater opportunity for charge carriers to undergo spin dependent scattering at interfaces of the pinned layers 130, 132, 130', 132', 230, and 232 and the interfaces of the free layers 110, 110', and 210. Thus, the MR of the dual spin filters 100, 100', and 200 is expected to be higher than that of a conventional spin valve 30' or dual spin valve 30" in a CIP configuration. Similarly, current is passed through the bulk of the magnetic layers 110, 130, 132, 110, 130', 132', 210, 230, and 232 in the dual spin filters 100, 100', and 200 respectively. This increases the probability of charge carriers undergoing spin dependent scattering in the magnetic layers 110, 130, 132, 110', 130', 132', 210, 230, or 232. It is thus expected that the MR of the dual spin filters 100, 100', and 200 is between that of a CIP configuration and a CPP configuration. Furthermore, the sheet resistance of the dual spin filters 100, 100', and 200 is expected to be higher than that of the CPP configuration. It is postulated that this is because current travels along the free layer 110, 110', or 210, which is relatively long and thin. Consequently, the signal from dual spin filters 100, 100', and 200 is expected to be relatively high.

Furthermore, the dependence of the signal from the dual spin filters 100, 100', and 200 on the read track width may be reduced. The free layer 110, 110', or 210 senses the magnetization of the recording media. For example, although depicted as longitudinal, the direction of the magnetic moment of the free layer 110, 110', or 210 may change due to a magnetic field generated by the magnetization of the recording media. Thus, the magnetic moments of the free layers 110, 110', or 210' may deviate from being perfectly longitudinal due to the data being read. The portion of the free layer 110, 110', or 210 that senses the magnetization of the recording media is the approximately the portion of the free layer 110, 110', or 210 associated with the read track width. This portion is near the center of the free layer 110, 110', or 210. The interfaces at which the charge carriers undergo spin dependent scattering are closer to the edges of the free layer 110, 110', or 210. Spin dependent scattering occurs at the interfaces between the free layer 110, 110', or 210 and the spacer layers 120 and 122, 120' and 122', or 220 and 222 and the interfaces between the spacer layers 120 and 122, 120' and 122', or 220 and 222 and the pinned layers 130 and 132, 130' and 132', or 230 and 232. In the dual spin filters 100, 100', and 200, these interfaces are relatively decoupled from the read track width. Therefore, the signal generated by the dual spin filters 100, 100', and 200 may be less dependent on the read track width. In a preferred embodiment, the signal produced by the dual spin filters 100, 100', and 200 may be relatively independent of the read track width. As a result, the dual spin filters 100, 100', and 200 may be capable of reading higher density recording media.

As higher densities of information are stored in the magnetic media, the read track width decreases. For the conventional spin valve 30' or the conventional dual spin valve 30", the decrease in read track width decreases the signal generated. Thus, the conventional spin valve 30' may be unable to read more than twenty gigabits per square inch media using a 0.3 μm or 0.2 μm read track width. In contrast, the decrease in the read track width may not decrease the signal generated by the dual spin filters 100, 100', and 200 because the signal from the dual spin filters 100, 100', and 200 are less dependent on the read track width. Thus, the dual spin filters 100, 100', and 200 may be capable of reading higher density recording media. Using current processing techniques, the read track width capable of being achieved is approximately 0.18 μm. This corresponds to an areal density of approximately forty gigabits per square inch. Similarly, the dual spin filters 100, 100', and 200 should be capable of reading higher density recording media corresponding to track widths of approximately 0.3 μm or 0.2 μm. Thus, the dual spin filters 100, 100', and 200 may be capable of reading data magnetically stored at this density because the dual spin filters 100, 100', and 200 may generate a signal that is less dependent on read track width.

Furthermore, the interlayer magnetic coupling present in a conventional spin valve 30' or the conventional dual spin valve 30" is reduced. Referring back to FIGS. 2A and 2B, the pinned layers 34, 44, and 52 are in proximity to the free layer 38 and 48. Thus, the pinned layer 34 and the pinned layer 44 and 52 generate a magnetic field in the region of the free layer 38 and the free layer 48, respectively. This magnetic field is in addition to the magnetic field generated by a recording media and, therefore, hinders the free layer 38 or 48 from reading the recording media. Referring back to FIGS. 3A, 3B, and 4, the pinned layers 130, 132, 130', 132', 230, and 232 are relatively distant from the portion of the free layer 110, 110', or 210 used in sensing the magnetization of bits stored by the recording media. This reduces the magnetic field generated by the pinned layers 130, 132, 130', 132', 230 or 232 in the region of the sensing portion of the free layer 110, 110', or 210. Consequently, the dual spin filters 100, 100', and 200 is better able to sense the magnetic field generated by the recording media.

The dual spin filters 100, 100', and 200 use the central portion of the free layer 110, 110', and 210 as the sensing region. This portion of the dual spin filters 100, 100', and 200 is thinner than the conventional spin valve 30' or the conventional dual spin valve 30". As a result, the MR head 10 which uses the dual spin filters 100, 100', and 200 as the MR sensor 30 can have a reduced spacing between the first shield 14 and the second shield 28 near the sensing portion of the free layer 110, 110', or 210. This helps to ensure that the magnetic field that affects the free layer 110, 110', or 210 is from the portion of the recording media desired to be read.

The dual spin filters 100 and 100' may use permanent magnets for the bias layers 140 and 142 and bias layers 140' and 142', respectively. Permanent magnets can be used to pin the magnetizations of the pinned layers 130, 132, 130', and 132' because the bias layers 140, 142, 140', and 142' are located away from the central portion of the free layer 110 or 110' used to sense the magnetization of the recording media. When permanent magnets are used in the bias layers 140, 142, 140', and 142', the operating temperature range of the dual spin filter 100 or 100' may be raised. The ability of a permanent magnet to pin the magnetizations of the pinned layers 130, 132, 130', and 132' is not limited by a blocking temperature. Thus, the dual spin filters 100 and 100' using permanent magnets for bias layers 140, 142, 140', or 142' may have a higher operating temperature limit.

Similarly when permanent magnets are used for the pinned layers 230 and 232, the operating temperature range of the dual spin filter 200 is larger. The dual spin filter 200 uses permanent magnets for the pinned layers 230 and 232 in lieu of biasing layers. Permanent magnets can be used for the pinned layers 230 and 232 because the pinned layers 230 and 232 are located away from the central portion of the free layer 210 used for sensing the magnetization of the recording media. Thus, use of permanent magnets should not adversely affect performance of the sensor 200. Furthermore, use of a single permanent magnetic layer, rather than a pinned layer and an AFM layer, simplifies processing of the dual spin filter 200 because fewer layers are fabricated.

The bias layers 140' and 142' of the dual spin filter 100' serve two functions. As discussed above, the bias layers 140' and 142' pin the magnetizations of the pinned layers 130' and 132', respectively. This function is analogous to the function of the AFM layers 32, 42, and 54 of the conventional spin valve 30' and the conventional dual spin valve 30". In addition, the bias layers 140' and 142' could stabilize the junctions. Thus, the bias layers 140' and 142' could be used to bias the magnetization of the free layer 110', ensuring that the free layer 110' has a single-domain structure.

Figure 5:
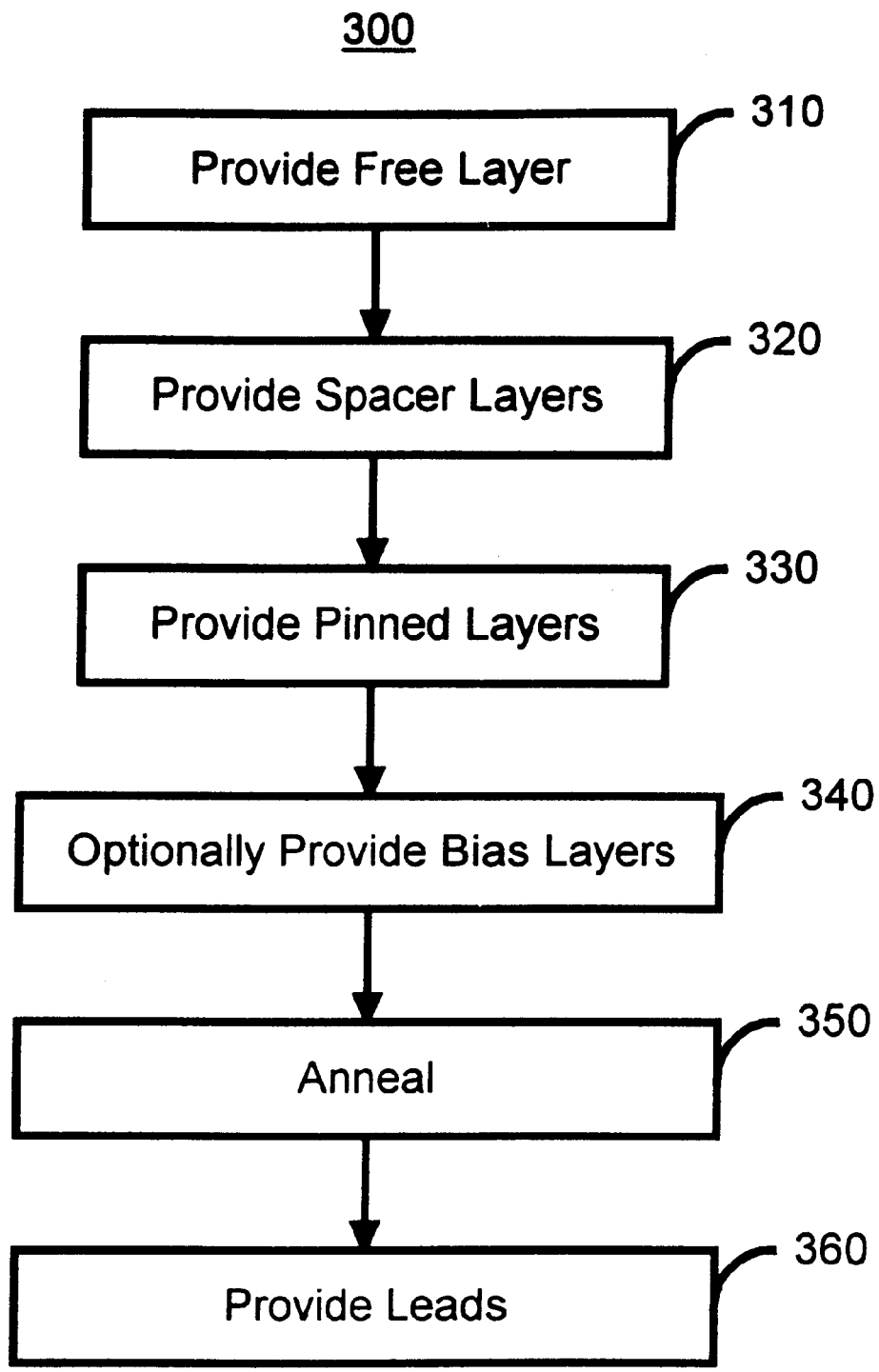
FIG. 5 is a flow chart of a method for providing a dual spin filter in accordance with the present invention.

Processing of the dual spin filter 100, 100', or 200 may also be simpler than processing for the CPP configuration. FIG. 5 depicts a high level flow chart of one embodiment of a method 300 for providing the dual spin filter 100, 100', or 200. The free layer 110, 110', or 210 is provided, via step 310. In one embodiment, step 310 includes providing the Ta layer 112, the Cu shunting layer 114, the magnetic free layer 110', the Ta capping layer 116, and the AFM layers 115 and 117. In a preferred embodiment, the magnetic free layer 110' includes NiFe. In a preferred embodiment, the free layer providing step 310 also includes setting the track width, a. This may be achieved by etching the free layer 110, 110', or 210, as well as layers underlying or above the free layer, such as the capping layer 116 and the underlayer 112. The spacer layers 120 and 122, 120' and 122', or 220 and 22 are then provided, via step 320. The pinned layers 130 and 132, 130' and 132', or 230 and 232 are provided, via step 330. The bias layers 140 and 142 or 140' and 142' are then provided for the dual spin filters 100 and 100', via step 340. Because the pinned layers 230 and 232 are permanent magnets in the dual spin filter 200, step 340 can be omitted for the dual spin filter 200. In one embodiment, the material for the spacer layers 120 and 122, 120' and 122', or 220 and 222, the pinned layers 130 and 132, 130' and 132', or 230 and 232, and the bias layers 140 and 142, 140' and 142', or 230 and 232 are deposited in steps 320, 330, and 340, respectively. The same resist structure can be used to delineate the spacer layers, the pinned layers, and the bias layers because the spacer layers 120 and 122, 120' and 122', and 220 and 222'; the pinned layers 130 and 132, 130' and 132', and 230 and 232; and the bias layers 140 and 142 and 140' and 142' are provided after the free layers 110, 110', and 210' have been etched. Thus, the spacer layers, pinned layers, bias layers, and leads of the dual spin filters 100, 100', and 200 may occupy a similar position as the hard bias and lead layers of the conventional MR head 10.

An anneal may also be performed, via step 350. The annealing performed in step 350 may have two components. A first anneal with a magnetic field perpendicular to the longitudinal direction of the free layer 110, 110', or 210 may be performed. This direction is perpendicular to the page in FIGS. 3A, 3B, and 4. Referring back to FIG. 5, this first part of anneal step 350 is used to align the bias layers 140, 142, 140', and 142'. If a permanent magnet is used for the bias layers 140, 142, 140' and 142', then this anneal saturates the permanent magnet. If, however, an AFM is used for the bias layers 140, 142, 140', and 142', then the anneal aligns the exchange field from the AFM. For the dual spin filter 200, this first anneal biases the pinned layers 230 and 232. A second anneal in longitudinal direction of the free layer 110, 110', or 210 is then performed. This anneal aligns the magnetization of the free layer 110, 110', or 210 perpendicular to that of the pinned layers 130, 132, 130', 132', 230, or 232. The leads are then preferably provided, via step 360.

The method 300 may be simpler and better controlled because the only magnetic layer in the sensing region of the dual spin filter 100, 100', or 200 is free layer 110, 110', or 210. This is in contrast to the conventional spin valve 30' or the conventional dual spin valve 30", which have several layers in the sensing region. Furthermore, the annealing step 350 is relatively simple to perform. For the dual spin filter 200, the step of providing a bias layer can be omitted, further simplifying processing. In addition, the method 300 is similar to a conventional method used to provide a CIP configuration spin valve. Consequently, the method 300 is relatively simple, yet provide dual spin filters 100, 100' and 200 having improved characteristics.

Figure 6:
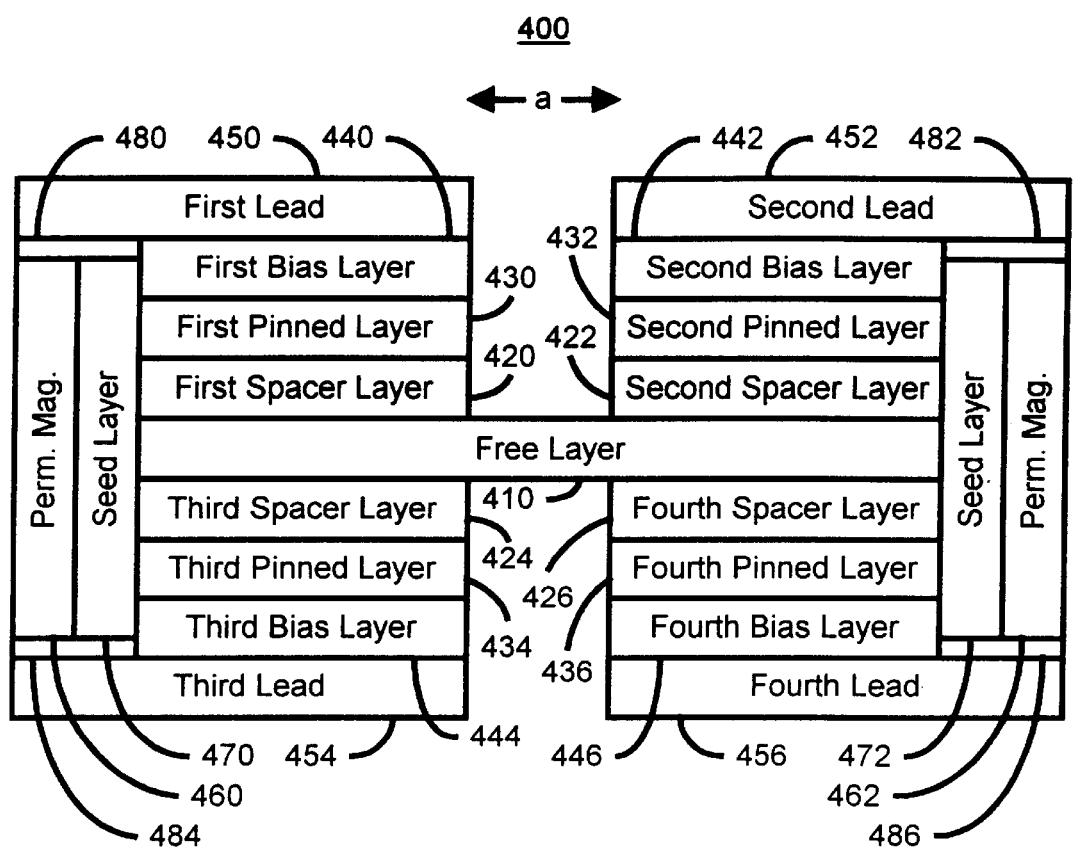
FIG. 6 is a simplified diagram of a quadruple spin filter in accordance with the present invention.

The dual spin filter 100, 100', and 200 can be extended to other similar configurations. For example, FIG. 6 depicts one embodiment of a quadruple spin filter 400 in accordance with the present invention. The quadruple spin filter 400 still includes a free layer 410 used to sense the magnetic field generated by a recording media. The free layer 410 could be similar to the free layer 110' depicted in FIG. 3B. The response of the quadruple spin filter 400 depends upon the angle between the free layer 410 and the pinned layers 430, 432, 434, and 436. A high resistance for the quadruple spin filter 400 occurs when the magnetization of the free layer 410 is approximately antiparallel to the magnetizations of the pinned layers 430, 432, 434, and 436. A low resistance for the quadruple spin filter 400 occurs when the angle between the magnetization of the free layer 410 and the magnetizations of the pinned layers 430, 432, 434, and 436 is approximately zero degrees. Referring back to FIG. 6, the quadruple spin filter includes four spacer layers 420, 422, 424, and 426. The spacer layers 420, 422, 424, and 426 separate the free layer 410 from four pinned layers 430, 432, 434, and 436, respectively. The magnetization of each of the pinned layers 430, 432, 434, and 436 is pinned by a hard bias layer 440, 442, 444, and 446, respectively. Note, however, that if a permanent magnet is used for the pinned layers 430, 432, 434, and 436, the hard bias layers 440, 442, 444, and 446 may be omitted. Also depicted in FIG. 6 are leads 450, 452, 454, and 456, which correspond to the leads 19a and 19b in FIG. 1. Referring back to FIG. 6, permanent magnets 470 and 472 may be used to bias the free layer 410 if permanent magnets are not used for the pinned layers 430, 432, 434, and 436. The permanent magnets 470 and 472 correspond to hard bias layers 18a and 18b depicted in FIG. 1. Referring back to FIG. 6, the quadruple spin filter 400 may also include optional insulating layers 480, 482, 484, and 486. The optional insulating layers 480, 482, 484, and 486 electrically insulate the first lead 450, the second lead 452, the third lead 454, and the fourth lead 456, respectively, from the permanent magnets 460 and 462 and the seed layers 470 and 472.

Because of its configuration, the quadruple spin filter 400 is expected to have benefits similar to those of the dual spin valves 100, 100', and 200. Thus, the signal of the quadruple spin filter 400 should be less dependent on the read track width. This allows the quadruple spin filter 400 to read higher density recording media. The MR of the quadruple spin filter 400 should be higher than that of the CIP configuration. The sheet resistance of the quadruple spin filter 400 may also be higher than that of the CPP configuration. Because the free layer 410 is the only magnetic layer in the sensing region, the magnetic interaction between layers and the processing of the quadruple spin filter 400 should be simplified. Furthermore, permanent magnets can be used for the biasing layers 440, 442, 444, and 446 or for the pinned layers 430, 432, 434, and 436. This can simplify processing of the quadruple spin filter 400 and increase the operating temperature limit of the quadruple spin filter.

A method and system has been disclosed for providing a spin filter, such as a dual spin filter or a quadruple spin filter, which has an increased signal, decreased magnetic interaction between layers and a reduced signal dependence on the read track width. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A magnetoresistive sensor comprising:
   a first pinned layer;
   a free layer having a length, a first end and a second end opposite to the first end, the length corresponding to the track width during operation of the magnetoresistive sensor and being defined by the first end and the second end;
   a first spacer layer disposed between the first pinned layer and the free layer, the first spacer layer having a first interface with the first pinned layer;
   a second pinned layer; and
   a second spacer layer disposed between the free layer and the second pinned layer, the second spacer layer having a second interface with the second pinned layer;
   wherein the first spacer layer and first pinned layer are in proximity to the first end of the free layer but not the second end of the free layer so that the first spacer layer is between the first pinned layer and the first end of the free layer, wherein the second spacer layer and second pinned layer are in proximity to the second end of the free layer but not the first end of the free layer so that the second spacer layer is between the second pinned layer and the second end of the free layer; and
   wherein a direction of a current passed through the magnetoresistive sensor is through the first interface, through the second interface, and along at least a portion of the length of the free layer.

2. The magnetoresistive sensor of claim 1 wherein the free layer has a first side and a second side;
   wherein the first pinned layer and the first spacer layer located in proximity to the first side of the free layer; and wherein
   the second pinned layer and the second spacer layer located in proximity to the second side of the free layer.

3. The magnetoresistive sensor of claim 1 wherein the first pinned layer has a first magnetization and wherein the magnetoresistive sensor further includes:
   a first antiferromagnetic layer in proximity to the first pinned layer, the first antiferromagnetic layer for pinning the first magnetization of the first pinned layer.

4. The magnetoresistive sensor of claim 3 wherein the second pinned layer has a second magnetization and wherein the magnetoresistive sensor further includes:
   a second antiferromagnetic layer in proximity to the second pinned layer, the second antiferromagnetic layer for pinning the second magnetization of the second pinned layer.

5. The magnetoresistive sensor of claim 1 wherein the first pinned layer has a first magnetization and wherein the magnetoresistive sensor further includes:
   a first permanent magnetic layer in proximity to the first pinned layer, the first permanent magnetic layer for pinning the first magnetization of the first pinned layer.

6. The magnetoresistive sensor of claim 5 wherein the second pinned layer has a second magnetization and wherein the magnetoresistive sensor further includes:
   a second permanent magnetic layer in proximity to the second pinned layer, the second permanent magnetic layer for pinning the second magnetization of the second pinned layer.

7. The magnetoresistive sensor of claim 1 wherein the first pinned layer and the second pinned layer further include CoFe.

8. The magnetoresistive sensor of claim 1 wherein the first and second spacer layers further include Cu.

9. The magnetoresistive sensor of claim 2 further comprising:
   a third pinned layer;
   a third spacer layer disposed between the third pinned layer and the free layer, the third spacer layer having a third interface with the third pinned layer, the third pinned layer and the third spacer layer being in proximity to the first side of the free layer;
   a fourth pinned layer; and
   a fourth spacer layer disposed between the free layer and the fourth pinned layer, the fourth spacer layer having a fourth interface with the fourth pinned layer, the fourth pinned layer and the fourth spacer being in proximity to the second side of the free layer;

wherein the direction of a current passed through the magnetoresistive sensor is also through the third interface and through the fourth interface.

10. A method for providing a magnetoresistive sensor comprising the steps of:
   (a) providing a first pinned layer;
   (b) providing a free layer having a length, a first end and a second end opposite to the first end, the length corresponding to the track width during operation of the magnetoresistive sensor and being defined by the first end and the second end;
   (c) providing a first spacer layer disposed between the first pinned layer and the free layer, the first spacer layer having a first interface with the first pinned layer;
   (d) providing a second pinned layer; and
   (e) providing a second spacer layer disposed between the free layer and the second pinned layer, the second spacer layer having a second interface with the second pinned layer;
   wherein the first spacer layer and first pinned layer are in provided proximity to the first end of the free layer but not the second end of the free layer so that the first spacer layer is between the first pinned layer and the first end of the free layer, wherein the second spacer layer and second pinned layer are provided in proximity to the second end of the free layer but not the first end of the free layer so that the second spacer layer is between the second pinned layer and the second end of the free layer; and
   wherein a direction of a current passed through the magnetoresistive sensor is through the first interface, through the second interface, and along at least a portion of the length of the free layer.

11. The method of claim 10 wherein the free layer providing step (c) further includes the steps of:
   (c1) providing a tantalum underlayer;
   (c2) providing a copper seed layer;
   (c3) providing a magnetic free layer; and
   (c4) providing a tantalum capping layer.

12. The method of claim 10 wherein the free layer has a first side and a second side; wherein the first pinned layer and the first spacer layer located in proximity to the first side of the free layer; and wherein the second pinned layer and the second spacer layer located in proximity to the second side of the free layer.

13. The method of claim 10 wherein the first pinned layer has a first magnetization and wherein the method further includes the step of:
   (f) providing a first antiferromagnetic layer in proximity to the first pinned layer, the first antiferromagnetic layer for pinning the first magnetization of the first pinned layer.

14. The method of claim 13 wherein the second pinned layer has a second magnetization and wherein the method further includes the step of:
   (g) providing a second antiferromagnetic layer in proximity to the second pinned layer, the second antiferromagnetic layer for pinning the second magnetization of the second pinned layer.

15. The method of claim 10 wherein the first pinned layer has a first magnetization and wherein the method further includes the step of:
   (f) providing a first permanent magnetic layer in proximity to the first pinned layer, the first permanent magnetic layer for pinning the first magnetization of the first pinned layer.

16. The method of claim 15 wherein the second pinned layer has a second magnetization and wherein the method further includes the step of:
   (f) providing a second permanent magnetic layer in proximity to the second pinned layer, the second permanent magnetic layer for pinning the second magnetization of the second pinned layer.

17. The method of claim 10 wherein the first pinned layer and the second pinned layer further include CoFe.

18. The method of claim 1 wherein the first and second spacer layers further include Cu.

19. The method of claim 12 further comprising the steps of:
   (f) providing a third pinned layer;
   (g) providing a third spacer layer disposed between the third pinned layer and the free layer, the third spacer layer having a third interface with the third pinned layer, the third pinned layer and the third spacer layer being in proximity to the first side of the free layer;
   (h) providing a fourth pinned layer; and
   (i) providing a fourth spacer layer disposed between the free layer and the fourth pinned layer, the fourth spacer layer having a fourth interface with the fourth pinned layer, the fourth pinned layer and the fourth spacer being in proximity to the second side of the free layer;
   wherein the direction of a current passed through the magnetoresistive sensor is also through the third interface and through the fourth interface.

* * * * *